United States Patent [19]

Singh et al.

[11] 4,309,460
[45] Jan. 5, 1982

[54] PROCESS FOR PRODUCING GOLD FILMS

[75] Inventors: Shobha Singh, Summit; LeGrand G. Van Uitert, Morristown; George J. Zydzik, Columbia, all of N.J.

[73] Assignee: Bell Telephone Laboratories, Incorporated, Murray Hill, N.J.

[21] Appl. No.: 196,477

[22] Filed: Oct. 14, 1980

Related U.S. Application Data

[63] Continuation of Ser. No. 850,775, Nov. 11, 1977, abandoned.

[51] Int. Cl.³ .............................................. B05D 3/02
[52] U.S. Cl. ...................................... 427/250; 427/91; 427/125; 427/126.3; 427/126.5; 427/314; 427/319; 427/404; 427/405
[58] Field of Search ................... 427/69, 99, 124, 125, 427/126.2, 166, 250, 91, 126.3, 126.5, 319, 404, 405

[56] References Cited

U.S. PATENT DOCUMENTS 2,799,600 7/1957 Scott ................................. 427/109
3,354,065 11/1967 Letter .............................. 704/158 R

*Primary Examiner*—Bernard D. Pianalto
*Attorney, Agent, or Firm*—Walter G. Nilsen

[57] ABSTRACT

A process is described for producing devices and articles with gold films made by gold evaporation in which certain fluoride compounds are used to insure good adhesion of the gold film to the substrate. The process is particularly applicable to the production of gold films on non-metallic surfaces such as ceramic and glass surfaces. This procedure not only insures better adhesion of the gold film to the surface, but also permits greater processing variations without adversely affecting film adhesion.

11 Claims, 2 Drawing Figures

PROCESS FOR PRODUCING GOLD FILMS

This application is a continuation of application Ser. No. 850,775, filed Nov. 11, 1977, now abandoned.

BACKGROUND OF THE INVENTION

1. Field of the Invention

The invention is a process for producing devices with evaporated gold films.

2. Description of the Prior Art

Gold films are extensively used in a variety of applications including for decorative articles, e.g., watches, rings, earrings, cuff links, etc.), optical mirrors and other optical devices, as well as electronic circuitry. Gold evaporation is often a very convenient way of producing such gold films. Although such films can often be made with perfectly satisfactory properties for some applications, usually the gold atoms are deposited electrolytically or are driven into the surface by such procedures as sputtering or ion bombardment so as to produce adherent gold layers which are not easily removed by scraping. The processing parameters are most critical when gold is evaporated on non-metallic surfaces such as glass, plastics, ceramics native oxide coatings on various semiconductors such as silicon dioxide coatings on silicon wafers. Many attempts have been made to improve the adherence of evaporated gold, simplify processing and obtain greater reliability in putting down gold layers especially on non-metallic surfaces. Typical examples are the use of chromium undercoats or titanium-palladium undercoatings. These procedures are often tedious and require elaborate equipment and usually require particularly stringent processing conditions (e.g., temperature, surface preparation, etc.). For some applications, such undercoating material might readily oxidize or be subject to chemical electrolytic action including cation diffusion. Also, for many applications, insulting contacts are required as for electrode connections on crystals, capacitors, etc.

SUMMARY OF THE INVENTION

The invention is a procedure for producing articles or devices with evaporated gold films. Although pure gold is usually used in evaporated gold films, films with at least 90 percent by weight gold might be useful. Involved in the procedure is the use of a fluorine containing bonding agent on the surface being coated prior to the evaporation deposition of gold. Typical bonding agents are inorganic fluorides such as $CdF_2$, $PbF_2$, $PbFCl$, $InF_3$, $SnF_2$ and $BiF_3$. Certain other compounds are useful depending on the application. Gold films produced in accordance with the invention are found to have good adhesion to the surface and also good conductivity properties.

DETAILED DESCRIPTION

Figure 1:
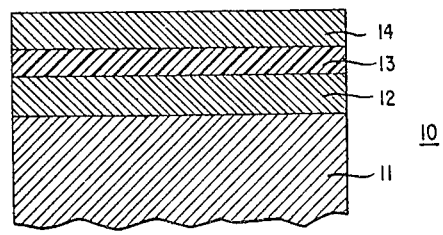
FIG. 1 shows a side view of part of an article with a gold film over the surface of lead borosilicate glaze in which indium fluoride is used as the bonding agent.

The essential feature of the invention is the use of certain inorganic fluoride compounds as films to insure good adhesion of evaporated gold to surfaces. A large variety of fluorides may be used, but the fluorides of cations following the transition metal series are most effective. This involves the cations with atomic numbers 29, 30, 31, 47, 48, 49, 50, 80, 81, 82 and 83. Certain of these fluorides are more desirable than others, generally because of their physical properties (melting point, vapor pressure, etc.) and their chemical stability. For example, silver fluoride decomposes under ordinary light so that it might be used with care. Particularly suitable compounds are $CdF_2$, $SnF_2$, $PbF_2$, $InF_3$ and $BiF_3$.

One of the advantages of this procedure is the relative simplicity of the process required for laying down the adherent gold layer. The substrate which may be either a metallic or non-metallic substance is first fabricated into the particular device or structure requiring a gold film. Generally, the invention applies more to non-metallic substrates or native oxides overlaying metals or semiconductors since gold adherence to clean metallic substrates is not generally as serious a problem. However, some devices might involve metal substrates or even metal substrates with relatively thin insulating layers. Some surface preparation may be necessary including cleaning, polishing, etc.

Both the fluoride film and the gold are put down by evaporation in a vacuum system. Although the exact vacuum conditions are not generally critical, typical pressures are about $10^{-3}$ to $10^{-6}$ Torr. Also the vacuum system may be flushed with an inert gas such as argon, before evaporation takes place.

In the fluoride evaporation substrate, temperature is not usually critical other than avoidance of temperatures destructive to substrate, fluoride, etc. For example, it is preferred that the substrate temperature remain below the melting point of the fluoride used. A temperature between 20 degrees C. and 150 degrees C. or the ambient temperature of the substrate inside the vacuum system is preferred for convenience. Various fluoride thicknesses may be used, but a thickness of approximately 50–500 Angstroms generally yield excellent results. The substrate may be removed from the vacuum system before gold evaporation. However, it is generally preferred for convenience and to insure against surface contamination to carry out at least part of the gold evaporation immediately after fluoride evaporation and without removal from the vacuum system.

On gold evaporation, certain substrate temperatures improve gold adhesion depending on the fluoride used and the nature of the substrate. These substrate temperature conditions apply to the initial deposition of gold (usually the first 50–500 Angstroms) and subsequent gold deposition may be carried out at any reasonable temperature. It is preferred that this gold evaporation be carried out at between 20 and 150 degrees C.

The preferred temperature ranges for the initial deposition of gold are now discussed. It should be understood that these temperature ranges yield unusually good results particularly in terms of gold adhesion but wider temperature ranges also yield useful results. The preferred temperature range for $InF_3$ is 60–250 degrees C. and for $BiF_3$ 100–250 degrees C. $SnF_2$ is particularly useful at low temperature ranges between room temperature and 100 degrees C. Both $CdF_2$ and $PbF_2$ are quite useful from room temperature to 250 degrees C. with best results being obtained around 150–180 degrees C. in each case. Some fluorides may yield excellent results below room temperature or above 250 degrees C. but such temperatures are generally inconvenient to obtain in an evaporation system.

Examples may be useful in illustrating the invention. Four substrates were used: fused silica, sodium calcium silicate microscope slides, alumina coated with lead aluminosilicate glaze and silicon wafers with their native oxide coating. The substrates were washed with detergent and rinsed in distilled water before using. Lead fluoride was used as the adhesive coating. The lead fluoride was evaporated to a thickness between 100 and 1000 Angstroms at a temperature of approximately 100 degrees C. Substrates were then heated to within the temperature range between 150–180 degrees C. and approximately 1000 Angstroms of gold was deposited on the substrate. The substrate was then cooled to below 100 degrees C. and more gold evaporated on the substrate.

The gold films could not be removed from the substrates checked by pulling, using adhesive tape, or by scratching lightly with a knife blade and therefore are considered to be strongly adherent. The adherence of the gold layer to all four substrates was considered excellent.

A similar experiment in which 300 Angstroms of $SnF_2$ followed by 500 Angstroms of gold was deposited on glazed alumina and silica substrates without heating the latter (40–60 degrees C. range) also showed that the gold films passed the tape and knife edge tests.

FIG. 1 shows a portion of a device 10 showing an alumina substrate 11 with a lead borosilicate glass 12 in which an evaporated gold layer has been put down by first producing a layer of indium fluoride 13 and then a layer of gold 14. Such a structure is useful in a variety of devices including for example, an electrical circuit device such as an integrated circuit.

Figure 2:
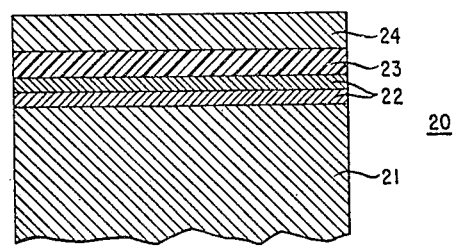
FIG. 2 shows a side view of an article with an evaporated gold film in which lead fluoride is used as the bonding agent to the native oxide overlaying silicon.

FIG. 2 shows a portion of a different type of device 20 with a silicon wafer substrate 21, with silicon oxide on top of doped silicon 22 and a gold layer produced by first laying down a lead fluoride layer 23 and then a gold layer 24.

What is claimed is:

1. A process for producing a device with at least one metal layer on a surface, said metal layer consisting of at least 90 percent by weight gold comprising the steps of:
   a. depositing a bonded layer consisting essentially of at least one fluoride selected from the group consisting of $CdF_2$, $SnF_2$, $PbF_2$, $InF_3$, $BiF_3$, $AgF$, $GaF_3$, and $ZnF_2$
   b. thereafter evaporating the metal layer onto the fluoride layer so that the gold layer adheres directly to the fluoride layer.

2. The process of claim 1 in which the metal layer consists essentially of gold.

3. The process of claim 1 in which the bonding layer is $CdF_2$, $SnF_2$, $PbF_2$, $InF_3$, or $BiF_3$.

4. The process of claim 1 in which the surface is coated with fluoride by evaporation of the fluoride.

5. The process of claim 1 in which the fluoride is selected from the group consisting of $CdF_2$ and $PbF_2$ and the initial temperature range of the fluoride on the surface during gold evaporation is between 20 and 250 degrees C.

6. The process of claim 5 in which the fluoride is $PbF_2$ and the initial temperature range is 150–180 degrees C.

7. The process of claim 1 in which the fluoride is $BiF_3$ and the initial temperature range for the evaporation of gold is between 100 and 250 degrees C.

8. The process of claim 1 in which the fluoride is $SnF_2$ and the initial temperature for gold evaporation is between room temperature and 100 degrees C.

9. The process of claim 1 in which the fluoride is $InF_3$ and the initial temperature for gold evaporation is between 60 and 250 degrees C.

10. The process of claim 1 in which the substrate is an insulator.

11. The process of claim 1 in which the substrate is an oxide.

* * * * *